US008982615B2

(12) United States Patent
Conte et al.

(10) Patent No.: US 8,982,615 B2
(45) Date of Patent: Mar. 17, 2015

(54) DECODING ARCHITECTURE AND METHOD FOR PHASE CHANGE NON-VOLATILE MEMORY DEVICES

(71) Applicant: STMicroelectronics S.r.l., Catania (IT)

(72) Inventors: Antonino Conte, Tremestieri Etneo (IT); Francesca Grande, Syracuse (IT); AlbertoJose' Dimartino, Palagonia (IT); Alfredo Signorello, Tremestieri Etneo Catania (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 0 days.

(21) Appl. No.: 13/780,280

(22) Filed: Feb. 28, 2013

(65) Prior Publication Data

US 2013/0258766 A1    Oct. 3, 2013

(30) Foreign Application Priority Data

Mar. 5, 2012   (IT) ............... TO2012A0192

(51) Int. Cl.
| | |
|---|---|
| G11C 11/00 | (2006.01) |
| G11C 8/00 | (2006.01) |
| G11C 13/00 | (2006.01) |
| G11C 8/12 | (2006.01) |
| G11C 7/12 | (2006.01) |
| G11C 8/10 | (2006.01) |
| G11C 5/14 | (2006.01) |

(52) U.S. Cl.
CPC .......... *G11C 13/0009* (2013.01); *G11C 13/004* (2013.01); *G11C 8/12* (2013.01); *G11C 5/146* (2013.01); *G11C 7/12* (2013.01); *G11C 13/0004* (2013.01); *G11C 13/0023* (2013.01); *G11C 13/0026* (2013.01); *G11C 13/0069* (2013.01); *G11C 2207/005* (2013.01); *G11C 8/10* (2013.01)
USPC ..................................... 365/163; 365/230.06

(58) Field of Classification Search
CPC ........ G11C 7/12; G11C 7/18; G11C 11/1655; G11C 11/1693; G11C 11/2255; G11C 11/2293; G11C 13/0021; G11C 13/0023; G11C 13/0026; G11C 13/0028; G11C 13/0069
USPC ...................... 365/148, 163, 230.06
See application file for complete search history.

(56) References Cited

U.S. PATENT DOCUMENTS

| | | | |
|---|---|---|---|
| 4,692,904 A | | 9/1987 | Sato et al. |
| 2003/0223285 A1* | | 12/2003 | Khouri et al. ................. 365/200 |

(Continued)

FOREIGN PATENT DOCUMENTS

| | | |
|---|---|---|
| EP | 1326258 | 7/2003 |
| EP | 2159802 | 3/2010 |

*Primary Examiner* — Son Mai
(74) *Attorney, Agent, or Firm* — Allen, Dyer, Doppelt, Milbrath & Gilchrist, P.A.

(57) ABSTRACT

A decoding system for a phase change non-volatile memory device having a memory array may include a column decoder that selects at least one column of the memory array during programming operations. The decoding system includes a selection circuit that includes selection switches on a number of hierarchical decoding levels for defining a conductive path between at least one column and a driving stage. A biasing circuit may supply biasing signals to the selection switches for defining the first conductive path and bringing the selected column to a programming voltage value. The programming selection circuit may have protection elements between columns and the selection switches. The selection switches and the protection elements may include metal oxide semiconductor (MOS) transistors having an upper threshold voltage level lower than the programming voltage.

14 Claims, 8 Drawing Sheets

(56) References Cited

U.S. PATENT DOCUMENTS

| | | |
|---|---|---|
| 2006/0291267 A1 | 12/2006 | Jenne et al. |
| 2008/0101125 A1* | 5/2008 | Conte et al. .............. 365/185.18 |
| 2010/0027327 A1* | 2/2010 | Chung et al. .................. 365/163 |
| 2010/0054031 A1* | 3/2010 | De Sandre et al. ........... 365/163 |
| 2010/0271885 A1* | 10/2010 | Scheuerlein et al. .... 365/189.09 |
| 2011/0007553 A1 | 1/2011 | Takagi et al. |

* cited by examiner

DECODING ARCHITECTURE AND METHOD FOR PHASE CHANGE NON-VOLATILE MEMORY DEVICES

FIELD OF THE INVENTION

The present invention relates to a decoding architecture and method for a phase change non-volatile memory device, for selecting and biasing columns and rows of the corresponding memory array during operations of reading and programming of the memory cells each time selected.

BACKGROUND OF THE INVENTION

In a known way, phase change non-volatile memories, for example, ePCMs (embedded Phase change Memories), represent a new generation of integrated memories, in which, to store information, the characteristics of materials having the property of switching between phases having different electrical characteristics are exploited. These materials may switch between an amorphous, disorderly, phase and a crystalline or polycrystalline, orderly, phase and resistivities of considerably different value, and consequently a different value of a datum stored, are associated with the two phases. For example, the elements of the VI group of the periodic table, such as tellurium (Te), selenium (Se), or antimony (Sb), referred to as chalcogenides or chalcogenic materials, can be advantageously used for manufacturing phase change memory cells. In particular, an alloy made up of germanium (Ge), antimony (Sb), and tellurium (Te), known as GST (having the chemical composition $Ge_2Sb_2Te_5$) is currently widely used in such memory cells. The phase changes may be obtained by locally increasing the temperature of the cells of chalcogenic material through resistive electrodes (generally known as heaters) set in contact with respective regions of chalcogenic material.

Access devices (for example, metal oxide semiconductor field effect transistors ((MOSFETs)), are connected to the heaters and selectively enable passage of a programming electric current through a respective heater. This electric current, by the Joule effect, generates the temperatures for the phase change. In particular, when the chalcogenic material is in the amorphous state, at high resistivity (the so-called RESET state), a current/voltage pulse (or a suitable number of current/voltage pulses) of duration and amplitude is applied to enable the chalcogenic material to cool slowly. Subjected to this treatment, the chalcogenic material changes its state and switches from the high-resistivity state to a low-resistivity state (the so-called SET state), and vice versa, when the chalcogenic material is in the SET state. More particularly, when the chalcogenic material is in the SET state, a current/voltage pulse having suitable duration and high amplitude is applied to cause the chalcogenic material to return into the high-resistivity amorphous state.

During reading, the state of the chalcogenic material is detected by applying a voltage sufficiently low as not to cause a sensible heating thereof, and then reading the value of the current that flows in the memory cell. Given that the current is proportional to the conductivity of the chalcogenic material, it may be possible to determine in which state the material is, and consequently, determine the datum stored in the memory cell.

In general, PCMs may have several advantages, for example, high scalability and reading speed combined with a reduced current consumption and a high efficiency. In a known way, and as shown schematically in FIG. 1 (limited to the parts for the description of the present embodiments), a non-volatile PCM device, designated by 1, generally comprises a memory array 2 made up of a plurality of memory cells 3, arranged in rows (wordlines, WL) and columns (bitlines, BL).

Each memory cell 3 includes a storage element 3a and an access element 3b, which are connected in series between a respective bitline BL and a terminal at reference potential (for example, ground, Gnd). In particular, a wordline WL is defined by the set of the control terminals of the access elements 3b aligned along one and the same row.

The storage element 3a includes a phase change material (for example, a chalcogenide, such as GST), and is, consequently, able to store data in the form of resistance levels associated with the different phases assumed by the same material (for this reason, in the attached figures it will at times be modelled as a resistor with variable resistance). The access element 3b, as in the embodiment illustrated, is an N-channel complementary metal oxide semiconductor (CMOS) transistor having its gate terminal connected to a respective wordline WL, its drain terminal connected to the storage element 3a, and its source terminal connected to the reference potential terminal. The access element 3b is controlled and biased to enable, when selected, the passage of a reading/programming driving current through the storage element 3a, having an appropriate value during respective reading/programming operations.

A column decoder 4 and a row decoder 5 enable selection of the memory cells 3, based upon the address signals received at input (generated in a known way and designated as a whole by AS) and relatively complex decoding schemes, and, in particular, selection of the corresponding wordlines WL and bitlines BL each time addressed, enabling biasing thereof at suitable voltage and current values. In particular, it is known that during programming operations, both when programming of the SET state and when programming of the RESET state of the chalcogenide material of the memory cells 3, supplying high-value current pulses to the storage elements 3a is desired for activation of the mechanisms of change of state. For example, programming of the SET state may be obtained via a rectangular current pulse having an amplitude between 200 µA and 300 µA, whereas programming of the RESET state may be obtained via a rectangular current pulse having an amplitude comprised between 500 µA and 700 µA.

The voltage on the selected bitline BL may be expressed via the following relation:

$$V_{BL} = R_{GST} \cdot I + V_{DS}$$

where $R_{GST}$ is the resistance value of the storage element 3a, I is the current circulating through it, and $V_{DS}$ is the voltage drop between the drain and source terminals of the access element 3b.

Considering a value of the resistance $R_{GST}$ of approximately 2.5 kΩ and a voltage drop $V_{DS}$ between 1 V and 1.5 V, the voltage on the bitline $V_{BL}$ may reach values in the region of 3 V. It follows that the voltage supplied to the column decoder 4 be higher than this value, for example, equal to 3.6 V, to enable the passage of the desired current during the programming step.

The column decoder 4 is moreover advantageously configured for providing, internally, two distinct paths towards the bitlines BL of the memory array 2 each time selected. The first path is a reading path to selectively create a conductive path between the selected bitline BL and a sense-amplifier stage 7 configured to compare the current circulating in the addressed memory cell 3 with a reference current to determine the datum stored. The second path is a programming path to selectively create a conductive path between the selected bitline BL and a driving stage 8 configured to supply the high currents for the programming operations of the SET and RESET states.

For this purpose, as will on the other hand be described in detail in what follows, the column decoder 4 comprises, for each reading and programming path, suitable selection elements, in particular, controlled transistors, connected in a cascaded fashion and configured for implementing a hierarchical address decoding for selection of the memory cells 3. In particular, as shown schematically in FIG. 2, the memory array 2 is generally arranged in a plurality of sectors, each of which comprises a plurality of memory cells 3. Each sector has a plurality of respective local bitlines designated once again by BL (distinct from those of the other sectors), and which are physically connected to the memory cells 3 of the memory array 2 present in the same sector. In addition, for each group of local bitlines BL, for example, four in number, two main bitlines MBL are provided, one for reading, designated by $MBL_r$, and one for programming, designated by $MBL_p$, when selected, at a higher hierarchical level, to enable subsequent selection at a lower hierarchical level of one or more of the respective local bitlines BL and of the corresponding memory cells 3. The main bitlines MBL traverse a number of sectors and may be selected in groups at a hierarchical decoding level still higher than the one associated with selection of the main bitlines MBL.

The column decoder 4 hence comprises, for each sector, at least one respective first-level decoding circuit for the reading operations and for the (SET and RESET) programming operations, coupled to, and operable for selecting, the respective local bitlines BL. The column decoder 4 also includes, for each group of sectors, a respective second-level decoding circuit, once again for the reading operations and for the programming operations, coupled to, and operable for selecting, the respective main bitlines MBL (as previously highlighted, also a decoding circuit at a still higher level, for selection in groups of the main bitlines MBL, possibly being provided).

In a known way, the decoding circuits for the reading operations are provided with N-channel CMOS transistors, whereas the decoding circuits for the programming operations are provided with P-channel CMOS transistors. The various CMOS transistors are, in any case given the high voltages that may occur in the various operating conditions, high-voltage transistors, i.e., transistors having oxides of large thicknesses.

In this regard, it is known, for example, that using 90-nm CMOS technology it is possible to provide low-voltage transistors (for example, ones using voltages ranging between 1.08 V and 1.32 V, equal to a logic voltage Vdd of the memory device 1, and able to withstand, for a short period of time, operating voltages of slightly higher values, for example equal to 1.8 V) having a smaller thickness of the gate oxide and a smaller occupation of area. Using 90-nm CMOS technology, it also possible to provide high-voltage transistors, i.e., ones designed to withstand higher operating voltages, with a maximum value, for example, between 1.55 V and 5.5 V, i.e., of a value higher or much higher than the logic voltage Vdd, and having a large thickness of the gate oxide and high occupation of area. High-voltage CMOS transistors are moreover used also for providing the biasing stages for biasing the wordlines WL (i.e., for biasing the control terminals of the access elements 3b of the memory cells 3), given the high voltages on the same control terminals for enabling the effective transfer of the programming currents and the presence of the desired voltages on the bitlines BL.

Known decoding architectures for PCM devices hence suffer from some limitations that do not enable full exploitation of their advantages. In particular, the use of a high number of high-voltage CMOS transistors for row and column decoding evidently entails a high occupation of area in the integrated implementation, whilst the possible use of dedicated masks and implants of dopants would entail high manufacturing costs. Moreover, the use of boosted voltages (to obtain the required voltage values) both in programming and in reading entails a high dynamic energy consumption.

SUMMARY OF THE INVENTION

The object of the present embodiments is consequently to address, at least in part, the problems highlighted previously, and, in particular, with respect to consumption of area and of energy and the associated high manufacturing and operating costs. According to the present embodiments, a decoding architecture for a phase change non-volatile memory device that includes a memory array including a plurality of memory cells arranged in rows and columns. The decoding system may include a column decoder comprising a programming decoding circuit configured to select at least one of the columns during programming operations of corresponding ones of the plurality of memory cells. The column decoder may include a programming selection circuit which may include a plurality of selection switches arranged on hierarchical decoding levels and configured to be selectively operable in a cascaded fashion to define a first conductive path between at least one selected column and a driving circuit configured to supply a programming current.

The column decoder may also include a programming biasing circuit operatively coupled to the programming selection circuit and configured to supply to the plurality of selection switches corresponding biasing signals to define the first conductive path and bring the selected column to a desired programming voltage value.

The programming selection circuit may further include a plurality of protection elements between respective ones of the columns and respective ones of the plurality of selection switches. The plurality of selection switches and the plurality of protection elements may include a plurality of metal oxide semiconductor (MOS) transistors having an upper threshold voltage level lower than the desired programming voltage value, The programming biasing circuit may be configured to bias the plurality of protection elements to reduce occurrence, between terminals of the plurality of MOS transistors, of voltages higher than the upper threshold voltage level during the programming operations.

The programming voltage may include a boosted value voltage relative to a logic voltage supplied to the memory device. The plurality of MOS transistors may include low-voltage transistors.

The plurality of selection switches may include at least one first-level selection switch configured to select a corresponding one of the columns and at least one second-level selection switch configured to select a main column at a hierarchical decoding level higher than that of the corresponding column and coupled, in a cascaded fashion, to the at least one first-level selection switch to define the first conductive path. The at least one first-level selection switch and the at least one second-level selection switch may include p-type metal oxide semiconductor (PMOS) transistors. The programming decoding circuit may have a well-biasing terminal configured to bias a well region of the PMOS transistors via the programming biasing circuit with biasing voltages to reduce occurrence, between the terminals of said plurality of MOS transistors, of voltages higher than the upper threshold voltage level during the programming operations. The system may further include a control and timing circuit operatively coupled to the programming biasing circuit and configured to define successive biasing steps, preliminary to the programming operations, and define the first conductive path. Each of the successive biasing steps may correspond to a respective biasing condition of the plurality of selection switches by said programming biasing circuit. The successive biasing steps may include at least a first step of boosting a voltage of at least one internal node of the programming selection circuit to a value greater than or equal to the upper threshold voltage level.

The plurality of selection switches may include at least one first-level selection switch configured to select a corresponding column, and at least one second-level selection switch configured to select at least one main column at a hierarchical decoding level higher than that of the corresponding column and coupled in cascaded fashion to the at least one first-level selection switch to define the first conductive path. The at least one first-level selection switch and the at least one second-level selection switch may include p-type metal oxide semiconductor (PMOS) transistors. The programming decoding circuit may have a well-biasing terminal configured to bias a well region of the PMOS transistors via said programming biasing circuit. The control and timing circuit may be configured to define the first step of boosting to include at least one of voltage boosting the at least one main column and of the well-biasing terminal to a first pre-charging voltage lower than the programming voltage.

The control and timing circuit may be configured to define the successive steps to include at least one second voltage-boosting step, subsequent to the first, including at least one of voltage boosting of the at least one main column and of the well-biasing terminal up to a programming voltage higher than or equal to the desired programming voltage value. The control and timing circuit may be configured to execute the successive steps prior to bringing the at least one selected column to the desired programming voltage value.

The control and timing circuit may be configured to define the successive steps to further include at least one step of boosting a biasing voltage of a control terminal of the plurality of protection elements up to the first pre-charging voltage. The programming biasing circuit may be configured to supply at least one of the plurality of selection switches with a biasing signal having different voltage levels in different biasing conditions comprising at least one of a zero voltage, a logic voltage supplied to the memory device, a first pre-charging voltage higher than the logic voltage, and a programming voltage higher than the first pre-charging voltage.

The programming biasing circuit may include, at an output, an inverter coupled between a first reference voltage and a first supply voltage. The first reference voltage and the first supply voltage may have values that vary dynamically in a mutually corresponding way for supplying, at an output of the inverter the biasing signal.

The programming biasing circuit may include, at an input, a latch having an output configured to supply an input of the inverter, and may be configured so that selection of a level of the biasing signal is carried out at a first value of the first supply voltage as a function of the output of said latch and, following upon the selection. The value of the biasing signal at a high level may be boosted jointly with boosting of the first supply voltage to a second value higher than the first value, with the output of the latch being latched at a value during the selection.

The column decoder may further include a reading decoding circuit configured to select at least one column during reading operations of corresponding one of the plurality of memory cells to selectively create a second conductive path between at least one local column and a reading circuit. The system may further include a row decoder configured to select at least one row of said memory array during one of programming and reading operations of corresponding ones of said plurality of memory cells. The row decoder may include a row-biasing unit configured to supply to at least one selected row a row-biasing signal having different voltage levels in different biasing conditions, comprising at least one of a zero voltage, a logic voltage supplied to the memory device, and a row-selection voltage higher than the logic voltage and lower than the desired programming voltage value. The row-biasing unit may include a first output transistor coupled between a second reference voltage and an output of the row-biasing unit, and a second output transistor coupled between a second supply voltage and the output of the row-biasing unit. The second supply voltage may have values that vary dynamically for supplying at the output, the row-biasing signal.

A method aspect is directed to a method for decoding a phase change non-volatile memory device having a memory array that includes a plurality of memory cells arranged in rows and columns. The method may include selecting, using a column decoder, at least one column during programming operations of corresponding one of the plurality of memory cells. The column decoder may include a programming selection stage that may include a plurality of selection switches arranged on hierarchical decoding levels. Selecting may include supplying to the plurality of selection switches corresponding biasing signals to define a first conductive path between at least one selected column and a driving stage, supplying a programming current, and bringing the selected column to a desired programming voltage value. The column decoder may further include a plurality of protection elements between respective columns and respective ones of the plurality of selection switches. The plurality of selection switches and the plurality of protection elements may include metal oxide semiconductor (MOS) transistors having an upper threshold voltage level lower than the desired programming voltage value. The method may further include biasing the plurality of protection elements to reduce occurrence, between terminals of the MOS transistors, of voltages higher than the upper threshold voltage level during the programming operations.

DETAILED DESCRIPTION OF THE PREFERRED EMBODIMENTS

Figure 1:
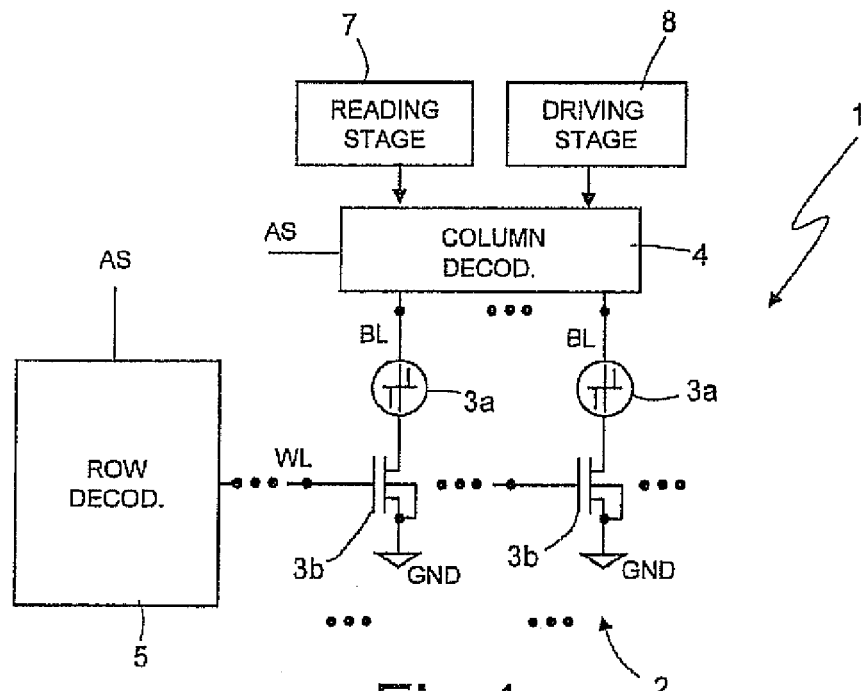
FIG. 1 is a schematic block diagram of a non-volatile PCM device according to the prior art.
Figure 2:
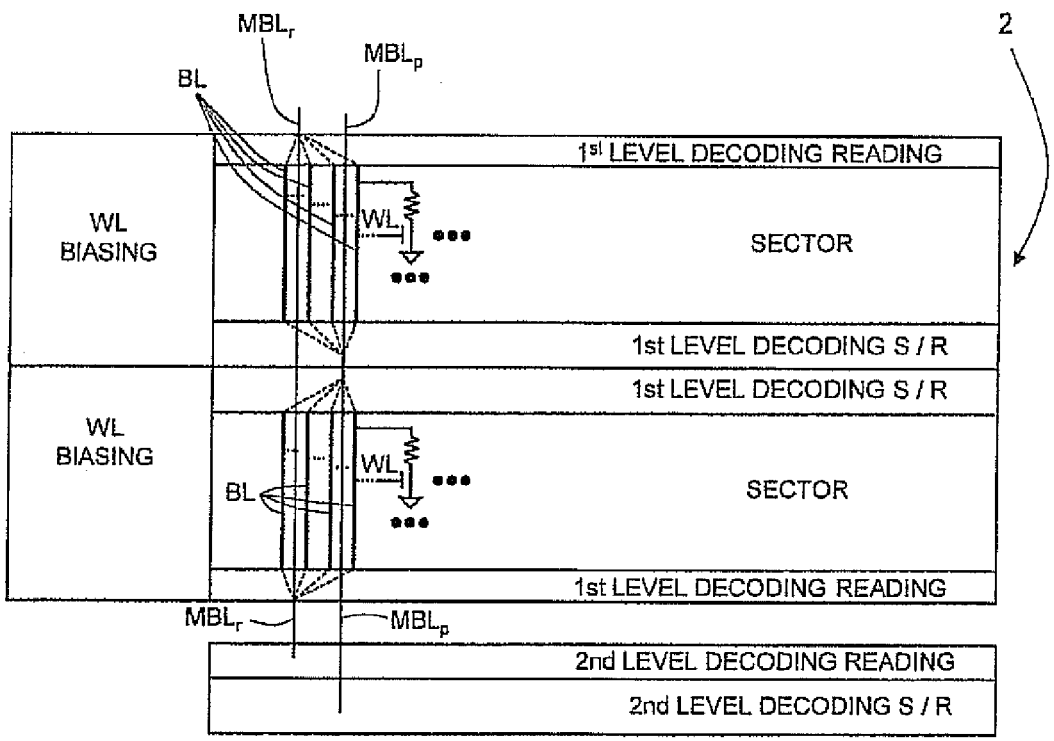
FIG. 2 is a diagram of the hierarchical structure of part of the memory device of FIG. 1 and of the corresponding decoding architecture according to the prior art.

As will be described in detail, one aspect of the present embodiments include providing the decoding architecture for a non-volatile memory device (for example, of the type described with reference to FIG. 1, to which reference is made herein, without repeating its description) using only MOS transistors of the low-voltage type. For this purpose, one or more of the following features are envisaged: use of appropriate protection elements, in cascade configuration; definition of appropriate conditions of dynamic biasing during the memory operations; and appropriate timing of variations of these biasing conditions during successive biasing steps for the various operations of reading and/or programming (SET and/or RESET) in the memory device.

Figure 3:
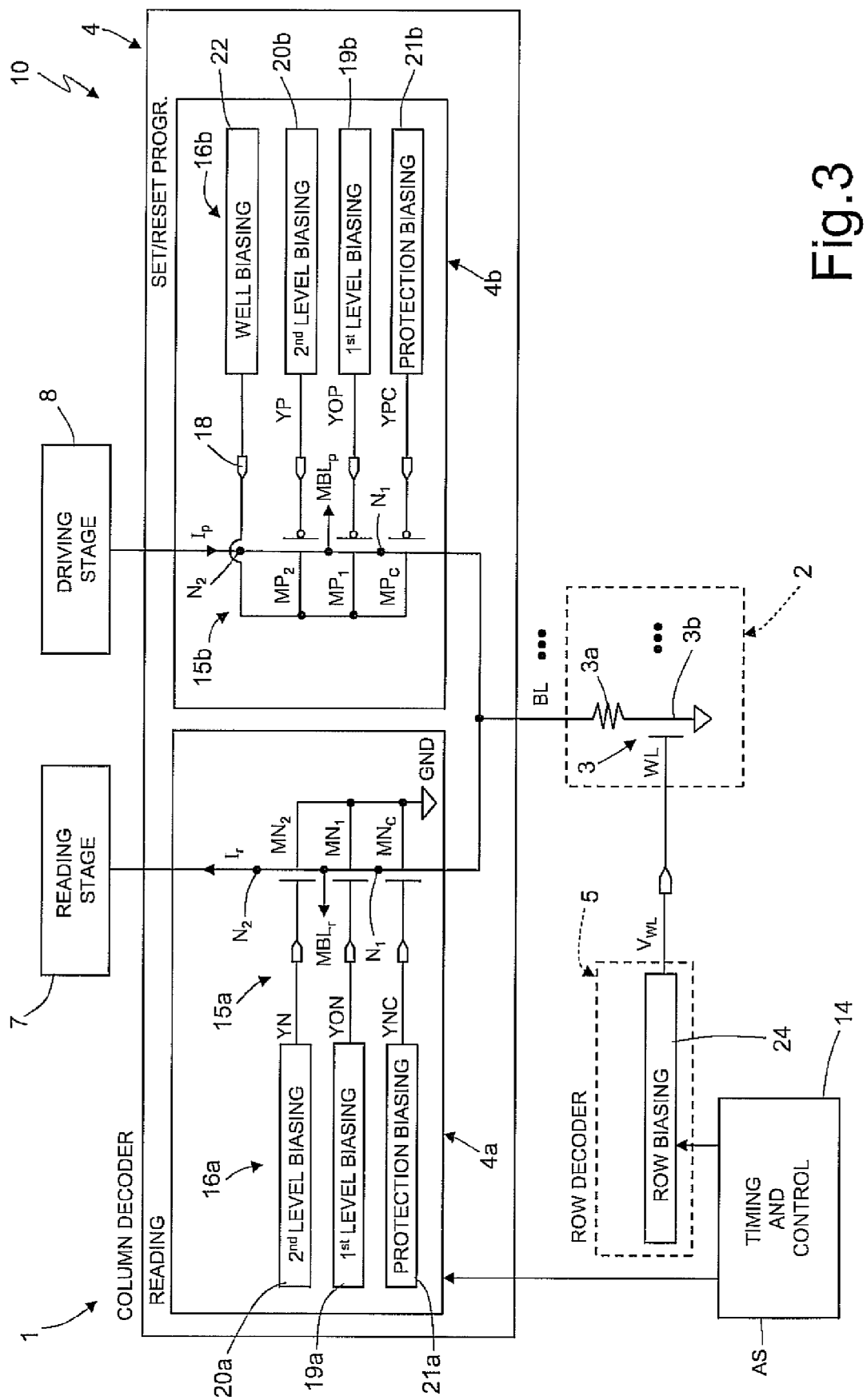
FIG. 3 is a schematic diagram of a decoding architecture for a non-volatile PCM device according to an embodiment of the present invention.

With reference to FIG. 3, according to one embodiment, the decoding architecture, designated as a whole by 10, for the memory device, designated once again by 1 (and whereof one memory cell 3 of the memory array 2 is shown for sake of simplicity), comprises a column decoder, once again designated by 4, which includes two distinct decoding paths, one for the reading operations and one for the programming operations, and, in particular, a reading decoding circuit 4a and a programming decoding circuit 4b. The decoding architecture also includes a row decoder, once again designated by 5, and a control and timing stage 14, operatively coupled to the column decoder 4 and to the row decoder 5, and designed to supply suitable control and timing signals, as will be described more fully in what follows.

In detail, each reading and programming decoding circuit 4a, 4b of the column decoder 4 comprises a respective selection stage 15a, 15b, and a respective biasing stage 16a, 16b, operatively coupled to the respective selection stage 15a, 15b to supply the suitable biasing quantities for selection and biasing of the columns of the memory array 2.

Each selection stage 15a, 15b comprises a plurality of selection switches that are hierarchically arranged on a number of decoding levels, in particular, at least one first decoding level and one second decoding level, and that can be selectively operated in cascaded fashion to create a conductive path between the selected columns and a sense-amplifier stage, once again designated by 7. The sense-amplifier stage is designed to compare the current circulating in the addressed memory cells 3 with a reference current to determine the datum stored, or, respectively, between the selected columns. A driving stage 8 is configured to supply the high currents for the programming operations of the SET and RESET states.

In greater detail, each selection stage 15a, 15b comprises at least a plurality of first-level selection switches (in FIG. 3 one is shown, for simplicity of illustration), namely, NMOS transistors, designated by MN1, in the case of the reading decoding circuit 4a, and PMOS transistors, designated by MP1, in the case of the programming decoding circuit 4b. The first-level selection switches or transistors are connected to one another in parallel and each between a respective main, or global, bitline MBL (designated once again by $MBL_r$ for the reading path and $MBL_p$ for the programming path) of the memory array 2 and a respective internal node N1. These transistors are operable for enabling selection and biasing of a respective local bitline BL and its connection to the respective main bitline MBL (according to a hierarchical decoding scheme of a known type, here not described in detail).

Each selection stage 15a, 15b also comprises at least a plurality of second-level selection switches (in FIG. 3 once again one is shown, for simplicity of illustration), namely, NMOS transistors, designated by MN2, in the case of the reading decoding circuit 4a, and PMOS transistors, designated by MP2, in the case of the programming decoding circuit 4b. The second-level selection switches or transistors are connected to one another in parallel and each between a respective internal node N2 and a respective main bitline MBL of the memory array 2. These transistors are operable for enabling selection and biasing of the respective main bitlines MBL (according to a hierarchical decoding scheme of a known type, here consequently not described in detail).

As it may be known, the number of the first-level and second-level selection switches MN1, MP1, MN2, MP2 depends on the organization and dimensions of the memory array 2 and on the corresponding division into sectors. Moreover, in the case illustrated, the internal node N2 is directly connected to the sense-amplifier stage 7, in the case of the reading decoding circuit 4a, for supplying thereto a reading current $I_r$ that has a value that is a function of the datum stored in the memory cell 3 in the reading step. Or the internal node N2 is directly connected to the driving stage 8, in the case of the programming decoding circuit 4b, for receiving therefrom a driving current $I_p$, of an appropriate value (for example, 700 μA, for a programming operation of a RESET state).

Alternatively, each selection stage 15a, 15b may comprise at least one further hierarchical decoding level, and, in particular, a plurality of third-level selection switches, which are designated hereinafter by MN3, MP3, in analogy with what has been already described. The plurality of third-level selection switches is set between the respective second internal node N2 and the sense-amplifier stage 7 or the driving stage 8.

According to a particular aspect, each selection stage 15a, 15b further comprises a plurality of protection elements, namely, NMOS transistors, designated by MNC for the reading decoding circuit 4a, and PMOS transistors, designated by MPC for the programming decoding circuit 4b. The transistors are connected in cascode configuration with respect to a respective first-level selection switch MN1, MP1 and between a respective internal node N1 and a respective local bitline BL of the memory array 2. As will be described in detail in what follows, the protection elements MNC, MPC may be suitably operated for protecting the selection switches at the various decoding levels, when selected and connected in cascaded fashion. The protection elements MNC, MPC may, for this purpose, be biased to contribute to the fact that, between the conduction and control terminals of the selection switches, voltage differences almost never occur, higher than a maximum voltage withstandable by the low-voltage transistors for short time intervals, which are precisely those for programming operations (for example, having a value of 1.8 V, slightly higher than the logic voltage Vdd).

Moreover, according to a further aspect, the selection stage 15b of the biasing decoding circuit 4b comprises a well-biasing terminal 18 electrically connected to the well regions (having a doping of an N type) of the various PMOS transistors that define at least the first-level and second-level selection switches MP1, MP2, and moreover the protection elements MPC. Each biasing stage 16a, 16b of the column decoder 4 in turn comprises a first-level biasing unit 19a, 19b, configured to supply suitable first-level biasing signals, designated by YON and YOP, to the control terminals of the first-level selection switches MN1, MP1 for selectively controlling closing and opening thereof. Each biasing stage 16a, 16b also includes a second-level biasing unit 20a, 20b, configured to supply suitable second-level biasing signals, designated by YN and YP, to the control terminals of the second-level selection switches MN2, MP2 for selectively controlling closing and opening thereof, and a protection biasing unit 21a, 21b, configured to supply suitable biasing signals, designated by YNC and YPC, to the control terminals of the protection elements MNC, MPC.

In addition, the biasing stage 16b of the programming decoding circuit 4b comprises a well-biasing unit 22, configured to supply suitable biasing signals to the well-biasing terminal 18. The row decoder 5 in turn comprises a row-biasing unit 24 configured to supply appropriate biasing signals, designated by $V_{WL}$, to the wordlines WL of the memory array 2, and, consequently, to the respective control terminals of the access elements 3b of the memory cells 3.

The control and timing stage 14 of the decoding architecture 10 receives, at its input address, signals AS, indicative of the columns and rows to be addressed for reading or programming operations of the corresponding memory cells 3. The control and timing stage 14 of the decoding architecture 10 is configured to appropriately control the biasing stages 16a, 16b of the column decoder 4 and the row-biasing unit 24 of the row decoder 5 so that they will select and supply the appropriate biasing quantities to the respective selection and access elements to set up the reading and programming conductive paths towards the memory cells 3.

In particular, the control and timing stage 14 is configured to supply control and timing signals for clocking, as will be clarified in detail in what follows, appropriate biasing steps that are temporally consecutive and preliminary to the effective reading/programming operations. These steps are distinguished by respective biasing conditions.

In particular, these biasing conditions are configured to reduce voltage difference that occur between the conduction and control terminals of the various low-voltage transistors in the decoding architecture 10. The voltage differences are higher than a maximum withstandable voltage (for example, a voltage slightly higher than the logic voltage Vdd), in the possible operating conditions. Given that, as highlighted previously, the use of high voltage values on the columns and rows during the programming operations is desired, these biasing steps may include, for example, pre-charging of one or more internal nodes and/or one or more of the main bitlines MBL to appropriate voltage values, higher than the same maximum withstandable voltage. For this purpose, the presence of the protection elements MNC, MPC and the suitable biasing of the well-biasing terminal 18 in the programming decoding circuit 4b may be exploited. In other words, for each of the operations of reading and programming of the SET and RESET states, suitable preliminary biasing steps are provided, to reduce subsequent stresses and overvoltages on the low-voltage transistors used in the decoding architecture 10, and moreover direct biasing of the junctions of the same transistors.

To clarify the concepts previously highlighted, a first scheme for management of biasing of the rows and columns of the memory array 2, during an operation of programming of the SET state or RESET state is now described, distinguished by a first sequence of biasing steps. In general, this sequence may first include selection of at least one wordline WL, then preparation of the main bitlines MBL (and corresponding pre-charging to appropriate voltage values), and subsequently effective selection and biasing of the local bitlines BL for access to the memory cells 3 involved in the programming operation. In this case, the wordline WL selected may remain active throughout the programming period, also when a verify operation is to be carried out (of a known type, here not described in detail) between two consecutive SET/RESET programming operations.

Figure 4A:
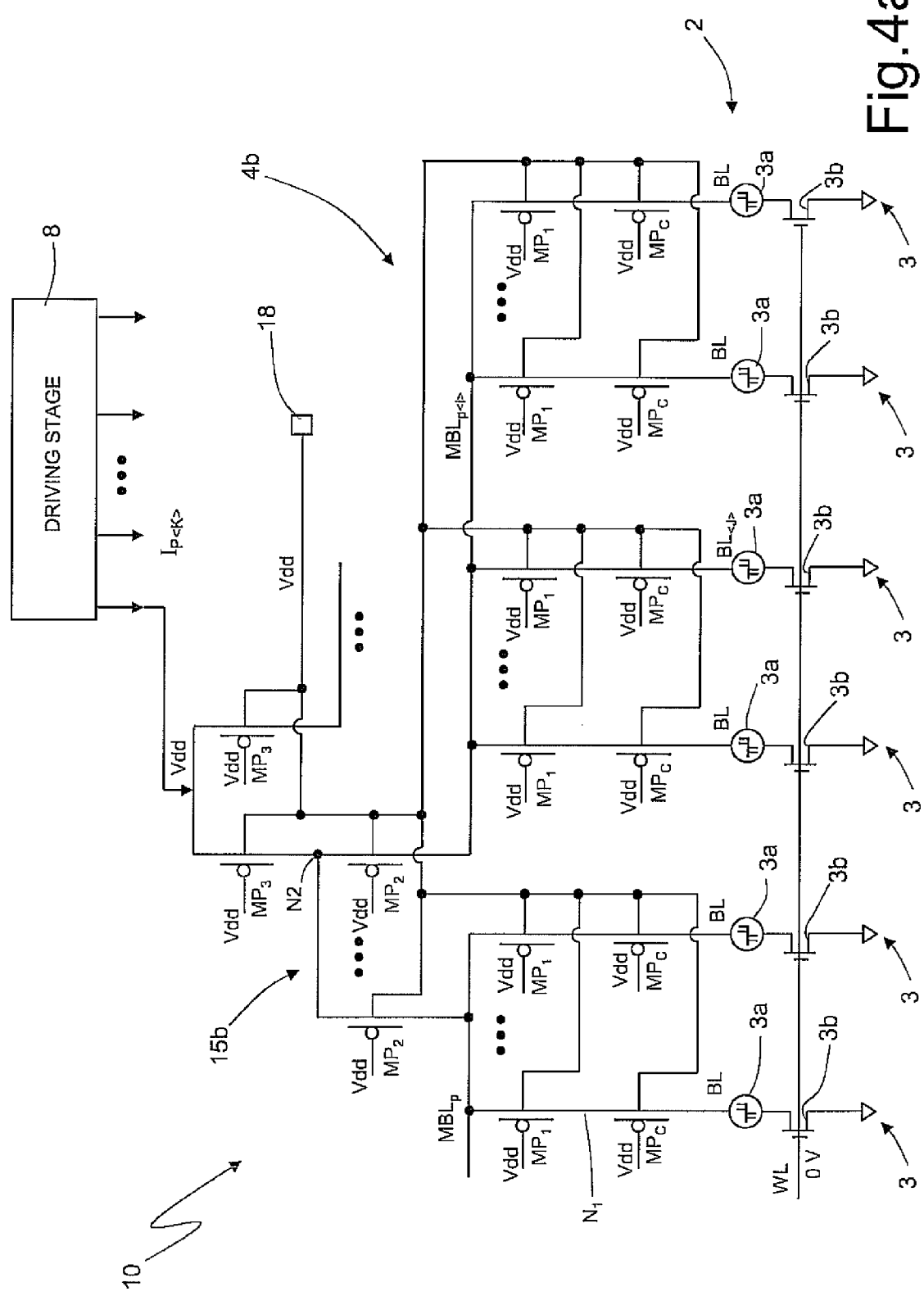
FIGS. 4a-4d are schematic diagrams of portions of the decoding architecture in successive steps of a biasing operating sequence according to an embodiment of the present invention.
Figure 4B:
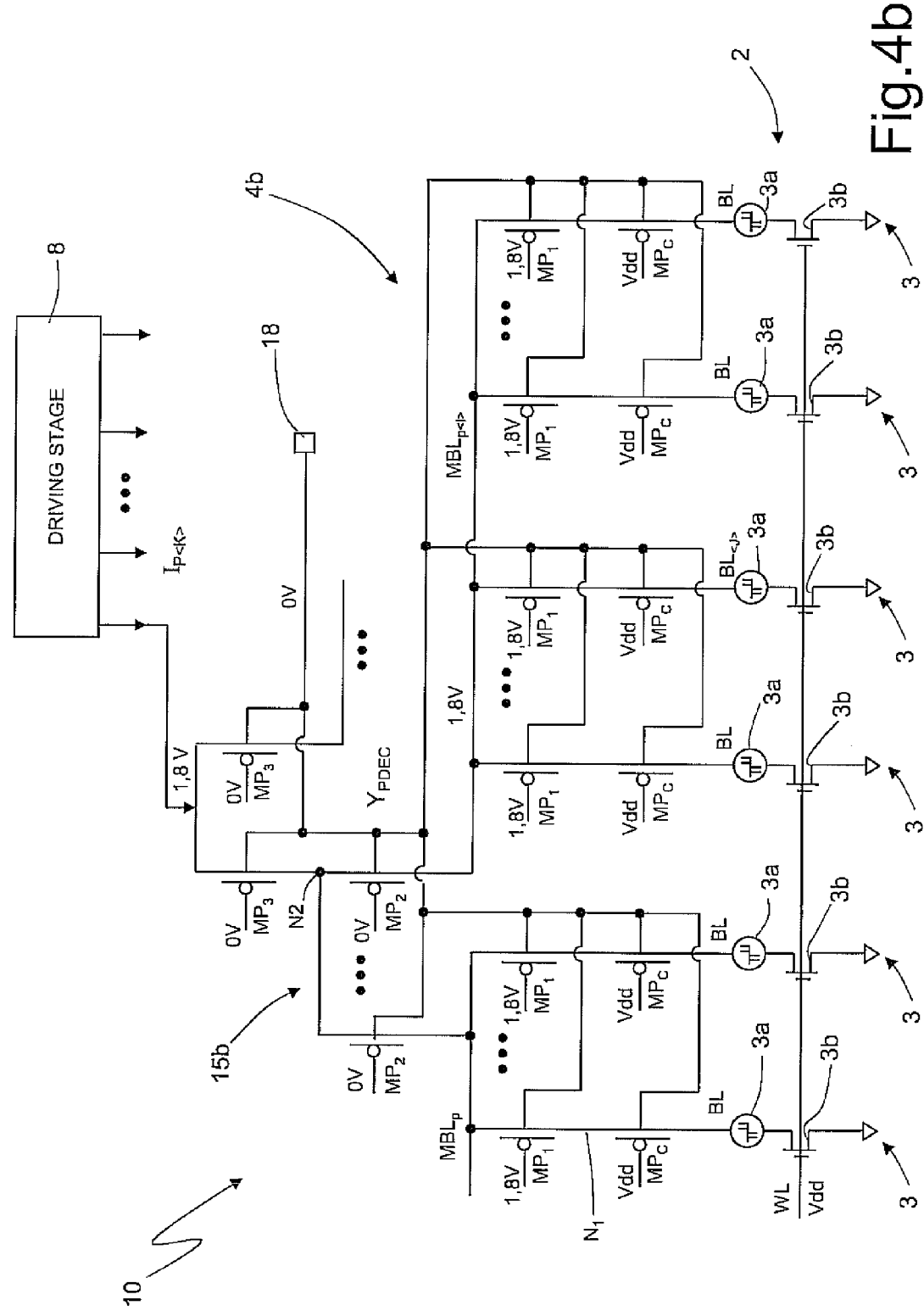

FIG. 4a shows a portion of the decoding architecture 10 that is relevant to the present discussion, highlighting biasing conditions in an initial step, prior to the programming operation. Shown by way of example are some switches of the plurality of first-level and second-level selection switches MP1, MP2, and, in this example, also third-level selection switches MP3 (in so far as these are present). Moreover, shown is the driving stage 8, which supplies, on a plurality of output lines, a respective plurality of driving currents $I_p(k)$, for example, thirty-two driving currents.

In this initial condition, the output lines of the driving stage 8 are set at the logic voltage Vdd (which is the same voltage at which the driving stage 8 itself is supplied). The well-biasing terminal 18 and the control terminals of the first-level, second-level, and third-level selection switches MP1, MP2, MP3 and of the protection elements MPc, are moreover set at the same logic voltage Vdd (by the biasing stage 16b) so that the corresponding PMOS transistors are off. In addition, the wordlines WL are deselected and set at the ground voltage, Gnd or 0 V (or similar low voltage to not turn on the access elements 3b).

In a subsequent biasing step, shown in FIG. 9b, the desired wordline WL is selected by bringing (by the row-biasing unit 24 of the row decoder 5) the same wordline WL to the logic voltage Vdd. The supply voltage to the decoding architecture 10 and to the driving stage 8 is boosted to a first pre-charging voltage $V_{pre1}$, slightly higher than the logic voltage Vdd, for example equal to 1.8 V, so that the output line of the driving stage 8 is set at the same first pre-charging voltage $V_{pre1}$, as also are the control terminals of the first-level selection switches MP1. Desired switches between the third-level and second-level selection switches MP3, MP2 are then activated by bringing the corresponding control terminals (by the biasing stage 16b) to a low voltage value, in this case 0 V (or similar low voltage value lower than the first pre-charging voltage $V_{pre1}$). In this way, the desired main bitline $MBL_p(i)$ is pre-charged at the value of the first pre-charging voltage $V_{pre1}$. It should be noted that the control terminals of the protection elements MPc remain, instead, at the value of the logic voltage Vdd.

Figure 4C:
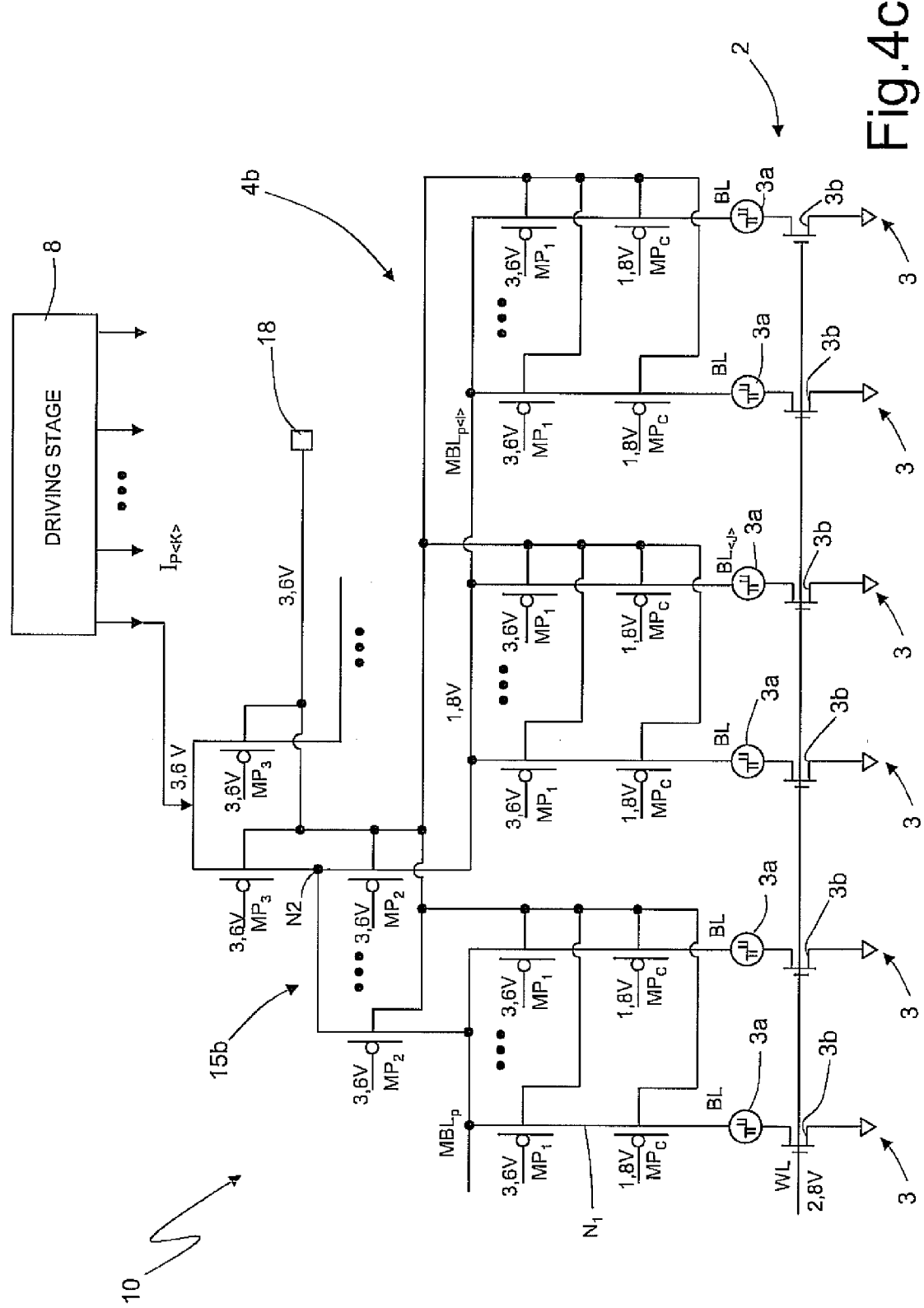

In a subsequent biasing step, as illustrated in FIG. 4c, the supply voltage to the decoding architecture 10 is further boosted and brought to a programming voltage $V_p$ of a high value, higher than the first pre-charging voltage $V_{pre1}$ and substantially coinciding with the voltage on the main bitline $MBL_p$ (for example, 3.6 V). The supply voltage is boosted and brought to the programming voltage $V_p$ to obtain, on the local bitline BL that is to be selected, a voltage level (for example, 3 V), to enable passage of the programming current.

Moreover, the third-level and second-level selection switches MP3, MP2 remain off because the voltage on the corresponding control terminals is also brought to a high value coinciding with the aforesaid programming voltage $V_p$. Also the voltage of the well-biasing terminal 18 is boosted from the first pre-charging voltage $V_{pre1}$ to the programming voltage $V_p$. In addition, the voltage of the control terminals of the protection elements MPc is boosted and shifted from the value of the logic voltage Vdd to the first pre-charging voltage $V_{pre1}$. In this same step, the voltage of the wordline WL is boosted and brought from the logic voltage Vdd to the final row-selection voltage $V_{row}$, of a value higher than the first pre-charging voltage $V_{pre1}$, for example equal to 2.8 V (or ranging between 1.5 V and 3V).

It should be noted in particular that, in this step, the presence of the protection elements MPc is such as to reduce the chances that on the first internal node N1 a voltage lower than the first pre-charging voltage $V_{pre1}$ is present, in this way protecting the first-level selection switches MP1 from overvoltages.

Figure 4D:
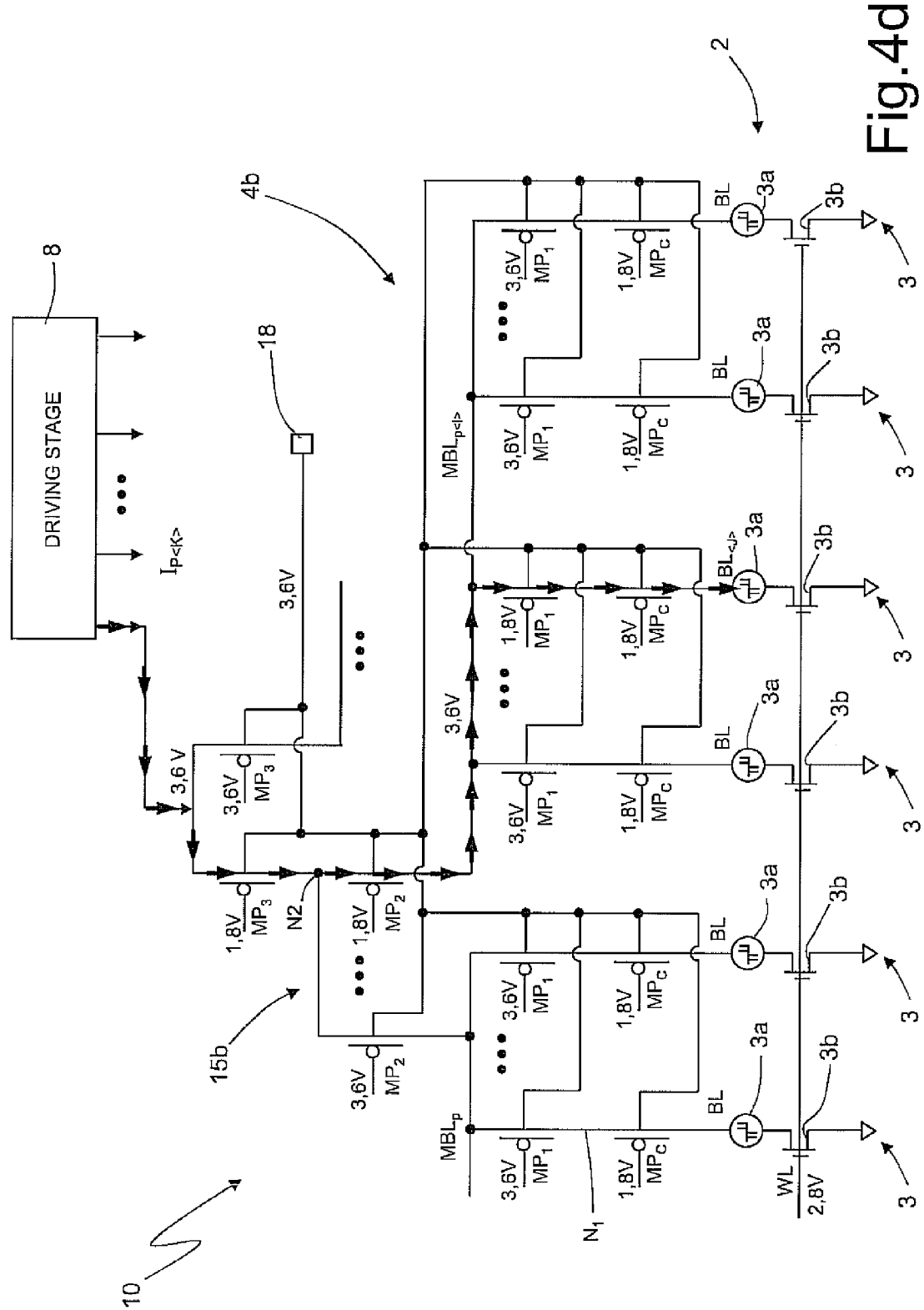

As shown in FIG. 4d, in a subsequent biasing step of the aforesaid first sequence, the second-level decoding is activated by turning on (i.e., by sending to a low value, in this case equal to the first pre-charging voltage $V_{pre1}$, the corresponding control terminals) the appropriate second-level selection switches MP2 (and the associated third-level selection switches MP3). In this way, the main bitline $MBL_p$<i> is pre-charged to the programming voltage $V_p$. Next, the effective path of programming current towards at least one selected local bitline BL<j> is activated, also activating the first-level decoding, i.e., sending to a low value, in this case equal to the first pre-charging voltage $V_{pre1}$, the corresponding control terminals of at least one first-level selection switch MP1. The selected local bitline BL<j> is thus brought to the desired programming voltage $V_p$, and a direct current path is created between the local bitline BL<j> itself and the output line of the driving stage 8, for supplying the desired biasing current $I_p$ (it should be noted that the voltage value at which the local bitline BL<j> is set is advantageously such as to enable passage of the biasing current $I_p$ through the memory cell 3). At this point, the SET or RESET programming pulses can be supplied to the selected memory cell/cells 3.

Through the first biasing sequence described previously, it is thus possible to transfer the desired high voltage and the high driving current towards the selected memory cell 3, albeit with the use of just low-voltage transistors, because of the appropriate timing of the biasing steps, which cause the voltage differences involved in the circuit never to be higher than a maximum voltage withstandable by the same transistors (in this case, typically never higher than the value of the first pre-charging voltage $V_{pre1}$, in the example equal to 1.8 V). In particular, this is possible by a suitable boosting in the pre-charging step of the voltage of the main bitline $MBL_p$<i> (first brought to the first pre-charging voltage $V_{pre1}$ and subsequently to the programming voltage $V_p$), the well-biasing terminal 18 (which is appropriately brought to the programming voltage $V_p$), and the control terminal of the protection elements MPc (which is appropriately brought to the first pre-charging voltage $V_{pre1}$ starting from the initial value equal to the logic supply voltage Vdd). In general, it should be noted that the programming voltage $V_p$ is a boosted voltage appropriately generated by a booster circuit (not shown) of the memory device 1, for example, a charge pump, and that the values of the pre-charging voltage $V_{pre1}$ and of the row-selection voltage $V_{row}$ are appropriate partitions of this boosted voltage.

A second possible biasing sequence is now described, without, in this case, referring to respective figures (not deemed necessary, also in the light of the foregoing description). In general, this second biasing sequence initially envisages selection of the main bitlines $MBL_p$, then preparation of the same main bitlines $MBL_p$ (i.e., with the corresponding pre-charging and boosting of the corresponding voltage value), and then activation of the local bitlines BL, and ends with selection of the wordlines WL for accessing the addressed memory cells.

In detail, the second biasing sequence includes, in a first biasing step, activation of all the second-level selection switches MP2 (for simplicity, reference is here made to a case in which, for the decoding operations, third-level selection switches are not desired), bringing the corresponding control terminals to a voltage of 0 V. In the same first step, the well-biasing terminal 18 is set to the logic voltage Vdd (which initially corresponds to the supply voltage of the decoding architecture 10).

In a second biasing step, the supply voltage is boosted and brought from the logic voltage Vdd to the first pre-charging voltage $V_{pre1}$ (for example, equal to 1.8 V) so that the main bitlines $MBL_p$ is pre-charged at the same first pre-charging voltage $V_{pre1}$. Also the well-biasing terminal 18 is brought to the first pre-charging voltage $V_{pre1}$.

In a third biasing step, the second-level selection switches MP2 not selected (i.e., that do not correspond to the address of the memory cells involved in the programming operations) are de-activated, bringing the corresponding control terminal from the voltage of 0 V to the first pre-charging voltage $V_{pre1}$. Next, in a fourth biasing step, selection of one or more local bitlines BL is carried out, bringing the control terminal of the corresponding first-level selection switches MP1 to the low level (in this case, to a voltage of 0 V, starting from a high value equal to the current value of the supply voltage, i.e., the first pre-charging voltage $V_{pre1}$).

In a subsequent fifth biasing step, the supply voltage of the decoding architecture 10 is brought from the value of the first pre-charging voltage $V_{pre1}$ to the boosted value of the programming voltage $V_p$ (for example, equal to 3.6 V). The well-biasing terminal 18 is also brought to the programming voltage $V_p$, as likewise the output line of the driving stage 8. Moreover, the control terminal of the protection elements MPc is brought from the previous value equal to the logic voltage Vdd to the first pre-charging voltage $V_{pre1}$.

Next, in a sixth biasing step of the second sequence, row selection is carried out, bringing at least one wordline WL from the value of 0 V to the value of the logic voltage Vdd. In a subsequent seventh step, the value of the wordline WL selected is brought to the row-selection voltage $V_{row}$, with a value to enable the effective passage of the desired programming current through the addressed memory cell/cells 3. The current programming pulse $I_p$, for programming the SET/RESET state may then be supplied to the addressed memory cell/cells.

As may emerge relatively clearly from the sequence of biasing steps just described, also in this case, the timing of the various biasing steps, as likewise the values of the biasing voltages applied to the control terminals of the selection switches and of the protection elements, is such as to reduce differences of potential higher than a maximum voltage withstandable by the low-voltage transistors used in the decoding architecture 10 from occurring. In particular, also in this case, appropriate steps of pre-charging of the voltage on the main bitlines $MBL_p$ may be included prior to selection of the local bitlines BL, as well as steps of boosting of the voltage on the control terminals of the protection elements MPC, in cascode configuration, and on the well-biasing terminal 18.

It will be clear that different sequences of the various biasing steps may also be included, which are essentially based on the same operating principles. In general, the reading operations, for which the reading decoding circuit 4a of the column decoder 4 is involved, may be less critical with respect to the values of the electrical quantities involved, and in particular, the voltage values used and the consequent stresses for the low-voltage transistors.

In fact, reading operations typically do not need voltage values higher than the logic voltage Vdd. The presence of the protection element MNc also in the reading decoding circuit 4a is, however, desired, in so far as it protects the reading path from overvoltages during the programming operations. The corresponding control terminal is biased at the value of the first pre-charging voltage $V_{pre1}$ so that voltages of higher value cannot be present on the respective first internal node N1, as a result of the cascade configuration.

In general, Table 1 below sums up the voltage values assumed in the decoding architecture 10 during the operations of reading and programming of the SET or RESET states (considering the exemplary values described previously). V (well N) identifies the voltage present on the well-biasing terminal 18.

TABLE 1

| signal | Reading | Programming (SET/RESET) |
|---|---|---|
| V(well N) | Vdd | 3.6 V |
| YP | Vdd | 1.8 V (selected) |
|  |  | 3.6 V (not selected) |
| $MBL_p$ | Vdd | 3.6 V |
| YOP | Vdd | 1.8 V (selected) |
|  |  | 3.6 V (not selected) |
| YPC | Gnd | 1.8 V |
| BL | 0.4 V | 2.8 V |
| YNC | Vdd | 1.8 V |
| YON | Vdd | Gnd |
| $MBL_r$ | 0.4 V | Gnd |
| YN | Vdd | Gnd |
| WL | Vdd | 2.8 |

Based on Table 1, it may be noted that the use of boosted voltages is desired only during the operations of programming of the SET and RESET states (not during reading, where the voltages required do not exceed the logic voltage Vdd), and that the first-level and second-level biasing units 19a, 20a of the reading decoding circuit 4a hence do not present critical aspects in design, and may include inverters of a traditional type capable of switching at output between the values Gnd and Vdd. It may also be noted that the first-level and second-level biasing units 19b, 20b of the programming decoding circuit 4b may instead use a specific design to supply at the output four different voltage levels, namely: 0 V (Gnd), the logic voltage Vdd, the first pre-charging voltage $V_{pre1}$, in the example illustrated equal to 1.8 V, and the programming voltage $V_p$, in the example illustrated equal to 3.6 V. Likewise, the row-biasing unit 24 is to be designed for supplying at the output three different voltage levels, namely: 0 V (Gnd), the logic voltage Vdd, and the row-selection voltage $V_{row}$, in the example illustrated equal to 2.8 V.

Figure 5A:
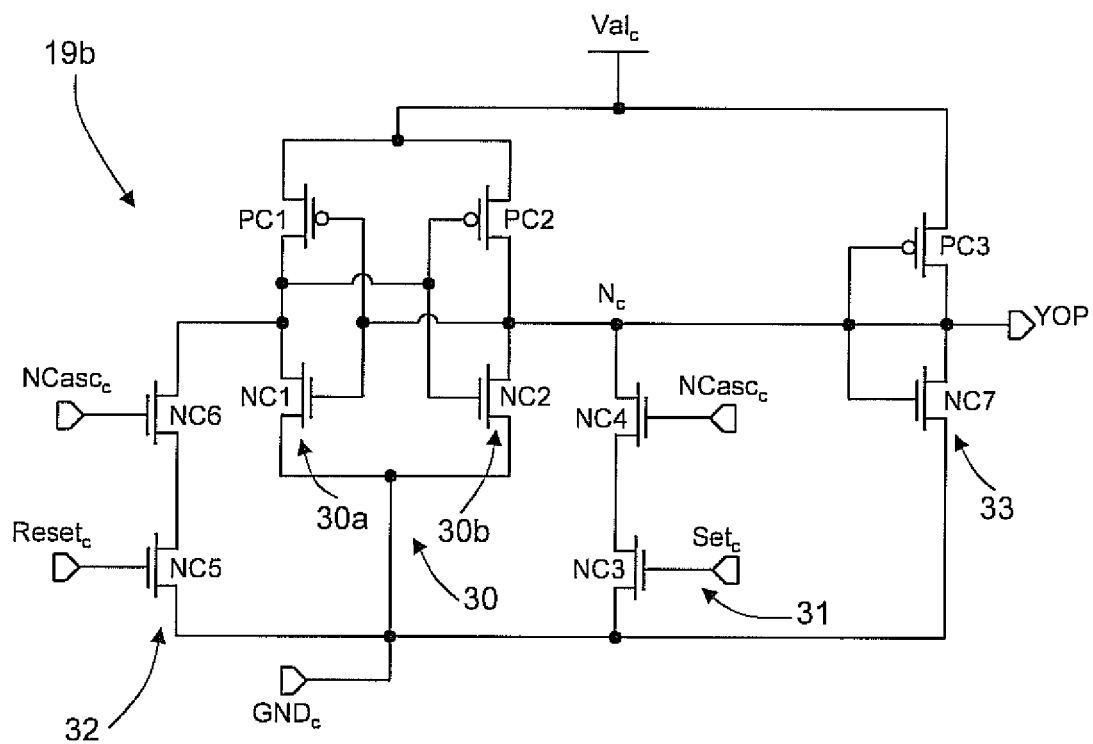
FIGS. 5a-5b are schematic circuit diagrams of a biasing unit of the column decoder of the decoding architecture of FIG. 3.
Figure 5B:
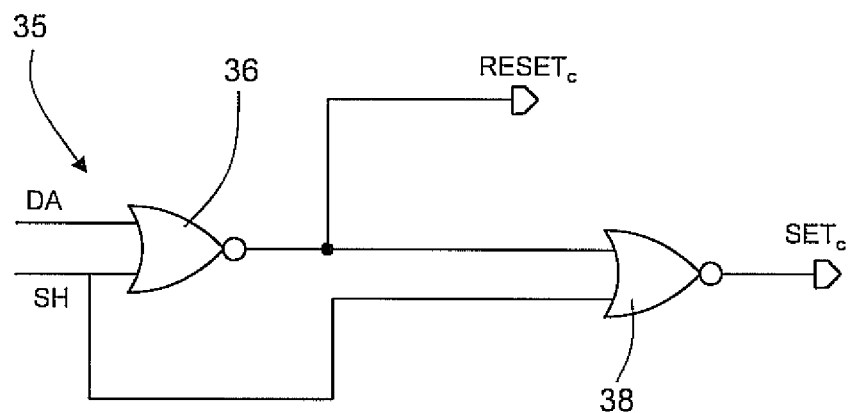

With reference to FIGS. 5a and 5b, a possible embodiment of the first-level biasing unit 19b of the programming decoding circuit 4b is now described, which is particularly suited for implementation of the second biasing sequence described previously. Similar considerations apply to the second-level biasing unit 20b. Other embodiments can, however, be devised for obtaining an equivalent circuit that is able to supply at output the various required voltage levels.

The first-level biasing unit 19b, in the possible embodiment shown in FIG. 5a, supplies the first-level biasing signal YOP at an output, and receives at input from the control and timing stage 14, a SET signal (having a high or low logic value and designated by $Set_c$—not to be mistaken with the SET state of the PCM cell), a RESET signal (which also has a high or low logic value and is designated by $Reset_c$—not to be mistaken with the RESET state of the PCM cell), a ground voltage, with dynamically variable value, designated by $Gnd_c$, and a supply voltage, which also has a dynamically variable value, designated by $Val_c$.

The first-level biasing unit 19b includes an S/R (Set/Reset) latch 30, a Set input branch 31, a Reset input branch 32, and an output inverter 33. In detail, the S/R latch 30 is connected between the ground $Gnd_c$ and the supply voltage $Val_c$, and is formed by a pair of CMOS inverters (a first inverter 30a formed by the PMOS transistor PC1 and NMOS transistor NC1, and a second inverter 30b formed by the PMOS transistor PC2 and NMOS transistor NC2), connected in parallel and in "crossed" configuration, i.e., with the output of the first inverter 30a defining the input of the second inverter 30b, and vice versa. Moreover, the input of the first inverter 30a is supplied by the SET input branch 31, whereas the input of the second inverter 30b is supplied by the RESET input branch 32.

In greater detail, the Set input branch 31 includes a pair of NMOS transistors NC3, NC4, connected in cascaded fashion between the input receiving the ground voltage $Gnd_c$ and an internal node $N_c$ (coinciding with the input of the first inverter 30a). The NMOS transistor NC3 receives, at its control terminal, the signal $Set_c$, whilst the NMOS transistor NC4, in cascode configuration, for protection of the NMOS transistor NC3, receives a cascoding signal $NCASC_c$ of a suitable value.

The Reset input branch 32 includes, in turn, a pair of NMOS transistors NC5, NC6, connected in cascaded fashion between the input receiving the ground voltage $Gnd_c$ and the input of the second inverter 30b. The NMOS transistor NC5 receives at its control terminal the signal $Reset_c$, whereas the NMOS transistor NC6, in cascode configuration, for protection of the NMOS transistor NC5, receives the cascoding signal $NCASC_c$, of a suitable value.

The output inverter 33 comprises a respective CMOS inverter connected between ground $Gnd_c$ and the supply voltage $Val_c$, and, in particular an NMOS transistor NC7, and a PMOS transistor PC3, having control terminals connected together and to the internal node Nc. The output of the CMOS inverter constitutes the output of the first-level biasing unit 19b, which supplies the first-level biasing signal YOP.

As shown in FIG. 5b, the control and timing stage 14 comprises a first logic unit 35, designed to generate the signals $Set_c$ and $Reset_c$ for the first-level biasing unit 19b. The first logic unit 35 includes a first NOR logic gate 36 and a second NOR logic gate 38. The first NOR logic gate 36 has a first input receiving a state signal DA, which is a function of the operating condition of the memory device 1 and is indicative of the value that has be assumed by the first-level biasing signal YOP (the state signal DA, in a way that is known and is evident to a person skilled in the field, is a function of the high-level address signals AS received by the control and timing stage 14). The first NOR logic gate 36 has a second input receiving a shift signal SH. The second NOR logic gate 38 has a first input connected to the output of the first NOR logic gate 36 (which moreover supplies the signal $Reset_c$), and a second input, which receives the shift signal SH, and supplies at output the signal $Set_c$.

The shift signal SH is indicative of the boosting of the supply voltage of the decoding architecture 10 to the boosted voltage (programming voltage $V_p$, in the example equal to 3.6 V). In particular, when its value is high, both of the signals $Set_c$ and $Reset_c$ assume a low value, irrespective of the value of the state signal DA.

The NMOS and PMOS transistors used for providing the first-level biasing unit 19b are of the low-voltage type. The supply voltage $Val_c$, supplied to the first-level biasing unit 19b, assumes alternatively, on the basis of an appropriate timing established by the control and timing stage 14 according to the reading or programming operations that have to be carried out, the value of the logic voltage Vdd or else the value of the supply voltage of the decoding architecture 10, which varies dynamically, during the steps of the biasing sequence from the first pre-charging voltage $V_{pre1}$, in the example equal to 1.8 V, to the programming voltage $V_p$, in the example equal to 3.6 V. In particular, upon shifting of the supply voltage $Val_c$ to the value of the programming voltage $V_p$ (determined by switching of the shift signal SH), the ground voltage $Gnd_c$ varies dynamically from the value of 0 V to the value of the first pre-charging voltage $V_{pre1}$.

Operation of the first-level biasing unit 19b may include the selection of the value (high or low) of the first-level biasing signal YOP being carried out when the supply voltage $Val_c$ is at the value of the logic voltage Vdd, as a function of the value of the state signal DA, and, consequently of the signals $Set_c$ and $Reset_c$ (in a way that will be evident from what has been described). Next, the possible shift upwards of the value of the supply voltage $Val_c$ determines a corresponding dynamic variation of the high value of the first-level biasing signal YOP, when previously selected. The high/low value of the first-level biasing signal YOP remains, in the meantime, "latched" by the S/R latch 30, in so far as switching to the high value of the shift signal SH brings both signals $Set_c$ and $Reset_c$ to the low logic value.

In particular, the presence of the protection and cascoding NMOS transistors NC4 and NC6, and the fact that the ground voltage Gnd, shifts dynamically upwards together with the supply voltage $Val_c$, enables use of just low-voltage transistors, without overvoltages occurring between the terminals of the same transistors.

Figure 6A:
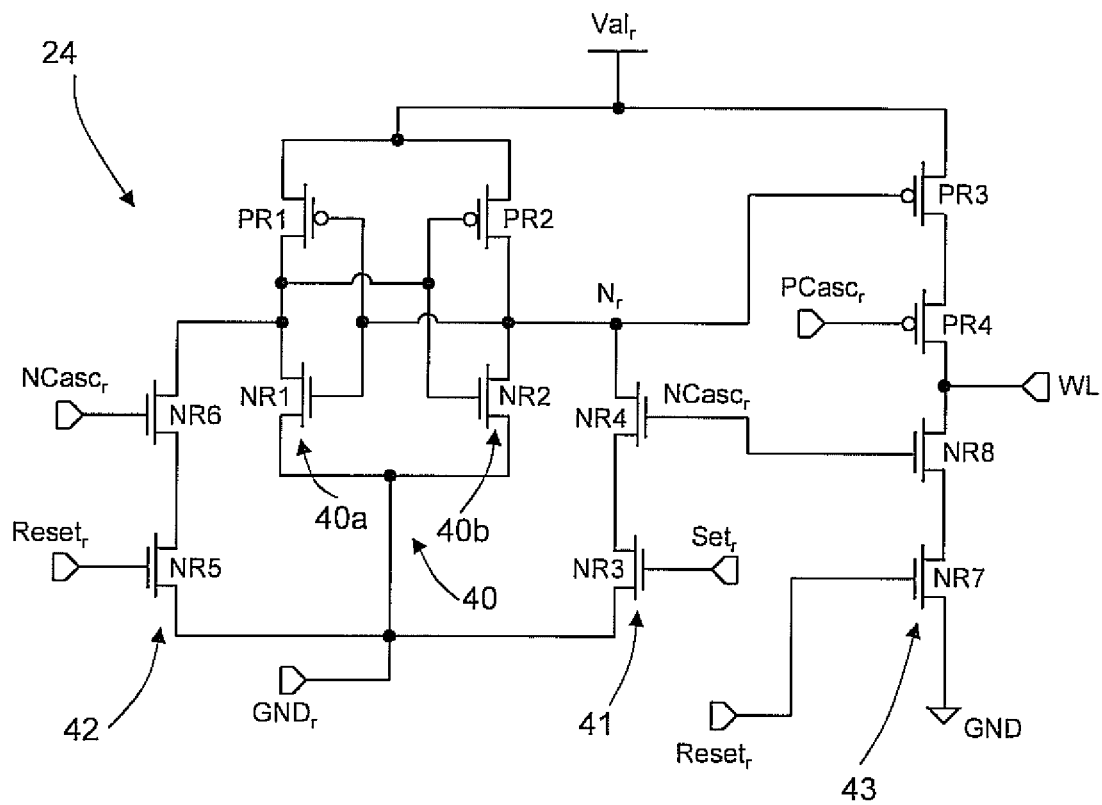
FIGS. 6a-6b are schematic circuit diagrams of a biasing unit of the row decoder of the decoding architecture of FIG. 3.
Figure 6B:
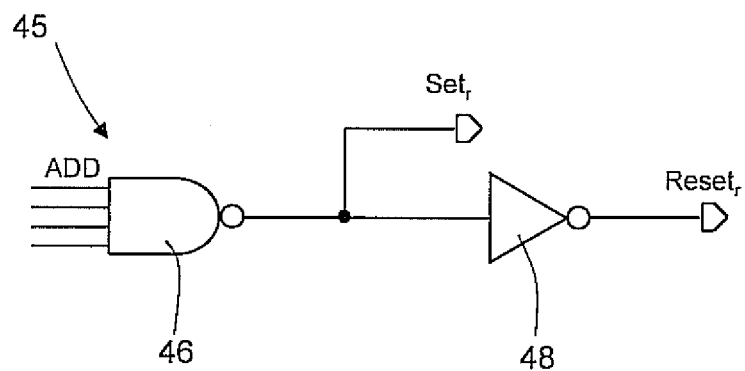

With reference to FIGS. 6a and 6b, a possible embodiment of the row-biasing unit 24 of the row decoder 5 is now described having a circuit structure that reproduces some of the characteristics previously highlighted for the first-level biasing unit 19b. Also in this case, other embodiments may, however, be provided for obtaining an equivalent circuit, which are able to supply at output the various voltage levels.

The row-biasing unit 24 comprises a respective S/R (Set/Reset) latch 40, a respective Set input branch 41, a respective Reset input branch 42, and an output branch 43. In detail, and as shown in FIG. 6a, the S/R latch 40 is connected between ground, here designated by $Gnd_r$, and supply, here designated by $Val_r$, of the row-biasing unit 24, both of which have a dynamically variable value, and is defined by a pair of CMOS inverters (a first inverter 40a defined by the PMOS transistor PR1 and NMOS transistor NR1, and a second inverter 30b defined by the PMOS transistor PR2 and NMOS transistor NR2), connected in parallel and in "crossed" configuration, i.e., with the output of the first inverter 40a defining the input of the second inverter 40b, and vice versa. Moreover, the input of the first inverter 40a is supplied by the Set input branch 41, whereas the input of the second inverter 40b is supplied by the Reset input branch 42.

In greater detail, the Set input branch 41 includes a pair of NMOS transistors NR3, NR4, connected in cascaded fashion between the input receiving the ground voltage $Gnd_r$ and an internal node $N_r$ (coinciding with the input of the first inverter 40a). The NMOS transistor NR3 receives, at its control terminal, the signal $Set_r$, whilst the NMOS transistor NR4, in cascode configuration, for protection of the NMOS transistor NR3, receives a cascoding signal $NCASC_r$, of an appropriate value (as described hereinafter).

The Reset input branch 42, in turn, includes a pair of NMOS transistors NR5, NR6, connected in cascaded fashion between the input receiving the ground voltage $Gnd_r$ and the input of the second inverter 30b. The NMOS transistor NR5 receives, at its control terminal, the signal $Reset_r$, whereas the NMOS transistor NR6, in cascode configuration, for protection of the NMOS transistor NR5, receives the cascoding signal $NCASC_r$.

The output branch 43 comprises a first output transistor PR3, of a PMOS type, connected between the input receiving the supply voltage $Val_r$ and the output of the row-biasing unit 24, which supplies the biasing signal $V_{WL}$ for the corresponding wordline WL, by interposition of a first protection transistor PR4, of a PMOS type. The control terminal of the first output transistor PR3 is connected to the internal node $N_r$, whereas the control terminal of the first protection transistor PR4 receives a respective cascoding signal $PCASC_r$, of an appropriate value (as described hereinafter). The output branch 43 further comprises a second output transistor NR7, of an NMOS type, connected between ground Gnd (having a fixed value, for example, 0 V) and the output of the row-biasing unit 24, which supplies the biasing signal $V_{WL}$ for the corresponding wordline WL by interposition of a second protection transistor NR8 of an NMOS type. The control terminal of the second output transistor NR7 receives the signal $Reset_r$, whereas the control terminal of the second protection transistor NR8 receives the cascoding signal $NCASC_r$.

As shown in FIG. 6b, the control and timing stage 14 comprises a second logic unit 45, designed to generate the signals $Set_r$ and $Reset_r$ for the row-biasing unit 24. The second logic unit 45 includes a NAND logic gate 46, receiving at its inputs appropriate address signals ADD for selection of the wordline WL (which are of a known type and are also generated starting from the high-level address signals AS received by the control and timing stage 14, by way of example, four of them are shown in FIG. 6b, each at a respective input of the NAND logic gate 46) and supplying, at its output, the signal $Set_r$. The second logic unit 45 also includes a logic inverter 48, which has its input connected to the output of the NAND logic gate 46 and supplies at output the signal $Reset_r$. Also in the circuit of the row-biasing unit 24, the NMOS and PMOS transistors used are of the low-voltage type.

The supply voltage $Val_r$, supplied to the row-biasing unit 24, assumes alternatively, based upon an appropriate timing established by the control and timing stage 14, the value of the logic voltage Vdd (in particular, during the reading operations), or else the row-selection voltage $V_{row}$, in the example previously described, equal to 2.8 V (in particular, during the operations of programming of the SET and RESET states). The cascoding signal $NCASC_r$ assumes the value of the logic voltage Vdd (in particular, during the reading operation), or a boosted value, halved with respect to the row-selection voltage $V_{row}$, in the example equal to 1.4 V (in particular, during the programming operations). Likewise, the cascoding signal $PCASC_r$ assumes the ground value Gnd (in particular, during the reading operation), or a boosted value, halved with respect to the row-selection voltage $V_{row}$, in the example equal to 1.4 V (in particular, during the programming operations). Moreover, the ground voltage $Gnd_r$ assumes, dynamically, the value Gnd (in particular, during the reading and row-selection operations), or a boosted value, halved with respect to the row-selection voltage $V_{row}$, in the example equal to 1.4 V (in particular, during the programming operations) to reduce stresses and overvoltages on the terminals of the transistors of the circuit.

As described previously, for the first-level biasing unit 19b of the column decoder 4, also in this case, during operation, the selection of the (high or low) value of the biasing signal $V_{WL}$ is carried out when the supply voltage $Val_r$ is at the value of the logic voltage Vdd, before the shift upwards of the value of the same supply voltage $Val_c$ occurs. Moreover, when the wordline WL is not selected, the biasing signal $V_{WL}$ has a fixed value, equal to 0 V (Gnd).

The advantages of the decoding architecture according to the present embodiments are clear from the foregoing description. In any case, it is once again emphasized that it affords a considerable saving of area in the integrated implementation, based upon the use of just low-voltage transistors. In particular, the occupation of area for the decoding architecture 10 is negligible as compared to the area of the memory array 2.

Moreover, it may be possible to obtain a considerable reduction of the current consumption based upon the fact that, during the reading operations, no boosted voltages are typically needed (all voltage levels are generally not higher than the logic voltage Vdd), and based upon the reduced dynamic consumption for selection/deselection of the columns and rows of the memory array 2. The decoding architecture 10, moreover, enables an increase in the operating speed to be obtained, once again due to the use of low-voltage transistors, which have reduced capacitance for driving. A higher speed in decoding, moreover, advantageously entails an optimization of the access times for the memory device 1.

In addition, associated with the use of just low-voltage transistors is also a saving in the corresponding manufacturing process based upon the reduction of the number of masks and implants. Advantageously, the separation of the current paths for the reading and programming operations enables sizing of the NMOS and PMOS transistors of the selection switches of the decoding circuits in reading and programming 4a, 4b in an optimal way, based upon the specific and different requirements to be met, respectively, in reading and writing. Sizing of the transistors may be carried out in an altogether independent way in the reading and programming paths, optimizing the electrical performance.

In general, the advantages set forth previously render the use of non-volatile PCMs more competitive in terms of performance, manufacturing, and operating costs. Finally, it is clear that modifications and variations may be made to what is described and illustrated herein, without thereby departing from the scope of the present embodiments, as defined in the annexed claims. In particular, it is evident that the phase change non-volatile memory device incorporating the biasing stage described may have a wide range of applications, for example, in microcontrollers, in applications with high safety requirements using smart cards with a contact interface (such as PAYTV systems, SIMs, TPM modules) that must satisfy the ETSI consumption specifications, and in contactless smart-card applications (RFIDs, NFCs, bank credit cards, etc.), where the memory module has a current budget limited by energy harvesting system (recovery of energy from the carrier) for operations (both writing operations and reading operations).

That which is claimed:

1. A decoding system for a phase change non-volatile memory device that includes a memory array comprising a plurality of memory cells arranged in rows and columns, the decoding system comprising:
    a column decoder comprising a programming decoding circuit configured to select at least one of the columns during programming operations of corresponding ones of said plurality of memory cells and comprising
        a programming selection circuit comprising a plurality of selection switches arranged on hierarchical decoding levels and configured to be selectively operable in a cascaded fashion to define a first conductive path between at least one selected column and a driving circuit configured to supply a programming current, and
        a programming biasing circuit operatively coupled to said programming selection circuit and configured to supply to said plurality of selection switches corresponding biasing signals to define the first conductive path and bring the selected column to a desired programming voltage value,
        said programming selection circuit further comprising a plurality of protection elements between respective ones of the columns and respective ones of said plurality of selection switches, wherein said plurality of selection switches and said plurality of protection elements comprise a plurality of metal oxide semiconductor (MOS) transistors having an upper threshold voltage level lower than the desired programming voltage value,
        said programming biasing circuit being configured to bias said plurality of protection elements to reduce occurrence, between terminals of said plurality of MOS transistors, of voltages higher than the upper threshold voltage level during the programming operations,
        said plurality of selection switches comprising at least one first-level selection switch configured to select a corresponding column, and at least one second-level selection switch configured to select at least one main column at a hierarchical decoding level higher than that of the corresponding column and coupled in cascaded fashion to said at least one first-level selection switch to define the first conductive path, said at least one first-level selection switch and said at least one second-level selection switch comprising p-type metal oxide semiconductor (PMOS) transistors, and said programming decoding circuit having a well-biasing terminal configured to bias a well region of said PMOS transistors via said programming biasing circuit; and
    a control and timing circuit operatively coupled to said programming biasing circuit and configured to define successive biasing steps, preliminary to the programming operations, and define the first conductive path, each of the successive biasing steps corresponding to a respective biasing condition of said plurality of selection switches by said programming biasing circuit, the successive biasing steps including at least a first step of boosting a voltage of at least one internal node of said programming selection circuit to a value greater than or equal to the upper threshold voltage level, said control and timing circuit being further configured to define the first step of boosting to include at least one of voltage boosting the at least one main column and of the well-biasing terminal to a first pre-charging voltage lower than the programming voltage value and define the successive biasing steps to further include at least one step of boosting a biasing voltage of a control terminal of said plurality of protection elements up to the first pre-charging voltage.

2. The system according to claim 1, wherein the programming voltage value comprises a boosted value voltage relative to a logic voltage supplied to the memory device, and wherein said plurality of MOS transistors comprises low-voltage transistors.

3. The system according to claim 1, wherein said control and timing circuit is configured to define the successive steps to include at least one second voltage-boosting step, subsequent to the first, including at least one of voltage boosting of the at least one main column and of the well-biasing terminal up to a programming voltage higher than or equal to the desired programming voltage value.

4. The system according to claim 1, wherein said control and timing circuit is configured to execute the successive steps prior to bringing the at least one selected column to the desired programming voltage value.

5. The system according to claim 1, wherein said programming biasing circuit is configured to supply at least one of said plurality of selection switches with a biasing signal having different voltage levels in different biasing conditions comprising at least one of a zero voltage, a logic voltage supplied to the memory device, a first pre-charging voltage higher than the logic voltage, and a programming voltage higher than the first pre-charging voltage.

6. The system according to claim 5, wherein said programming biasing circuit comprises, at an output, an inverter coupled between a first reference voltage and a first supply voltage, the first reference voltage and the first supply voltage having values that vary dynamically in a mutually corresponding way for supplying, at an output of said inverter the biasing signal.

7. The system according to claim 6, wherein said programming biasing circuit comprises, at an input, a latch having an output configured to supply an input of said inverter, and is configured so that selection of a level of the biasing signal is carried out at a first value of the first supply voltage as a function of the output of said latch and, following upon the selection, the value of the biasing signal at a high level is boosted jointly with boosting of the first supply voltage to a second value higher than the first value, with the output of said latch being latched at a value during the selection.

8. The system according to claim 1, wherein said column decoder further comprises a reading decoding circuit configured to select at least one column during reading operations of corresponding one of said plurality of memory cells to selectively create a second conductive path between at least one local column and a reading circuit.

9. The system according to claim 1, further comprising a row decoder configured to select at least one row of said memory array during one of programming and reading operations of corresponding ones of said plurality of memory cells, said row decoder comprising a row-biasing unit configured to supply to at least one selected row a row-biasing signal having different voltage levels in different biasing conditions, comprising at least one of a zero voltage, a logic voltage supplied to the memory device, and a row-selection voltage higher than the logic voltage and lower than the desired programming voltage value.

10. The system according to claim 9, wherein said row-biasing unit comprises:
a first output transistor coupled between a second reference voltage and an output of said row-biasing unit; and
a second output transistor coupled between a second supply voltage and the output of said row-biasing unit,
the second supply voltage having values that vary dynamically for supplying at the output, the row-biasing signal.

11. A decoding system for a non-volatile memory device comprising a plurality of memory cells arranged in rows and columns, the decoding system comprising:
a column decoder comprising a programming decoding circuit configured to select at least one of the columns during programming operations of corresponding ones of said plurality of memory cells and comprising
a programming selection circuit comprising a plurality of selection switches configured to define a first conductive path between at least one selected column and a driving circuit, and
a programming biasing circuit coupled to said programming selection circuit and configured to define the first conductive path and bring the selected column to a desired programming voltage value,
said programming selection circuit further comprising a plurality of protection elements between respective ones of the columns and respective ones of said plurality of selection switches, wherein said plurality of selection switches and said plurality of protection elements comprise a plurality transistors having an upper threshold voltage level lower than the desired programming voltage value,
said programming biasing circuit being configured to bias said plurality of protection elements to maintain voltages, between terminals of said plurality of transistors, lower than the upper threshold voltage level during the programming operations,
said plurality of selection switches comprises at least one first-level selection switch configured to select a corresponding column, and at least one second-level selection switch configured to select at least one main column and coupled, in a cascaded fashion, to said at least one first-level selection switch to define the first conductive path; and
a control and timing circuit coupled to said programming biasing circuit and configured to define successive biasing steps and define the first conductive path, each of the successive biasing steps corresponding to a respective biasing condition for said plurality of selection switches, the successive biasing steps including at least a first step of boosting a voltage of said programming selection circuit to a value greater than or equal to the upper threshold voltage level, said control and timing circuit further configured to define the first step of boosting to include at least one of voltage boosting the at least one main column and the programming decoding circuit to a first pre-charging voltage lower than the programming voltage value and define the successive biasing steps to further include at least one step of boosting a biasing voltage of said plurality of protection elements up to the first pre-charging voltage.

12. The system according to claim 11, wherein the programming voltage value comprises a boosted value voltage relative to a logic voltage supplied to the memory device, and wherein said plurality of transistors comprises low-voltage transistors.

13. A method for decoding a phase change non-volatile memory device having a memory array comprising a plurality of memory cells arranged in rows and columns, the method comprising:
selecting, using a column decoder, at least one column during programming operations of corresponding one of the plurality of memory cells, the column decoder comprising a programming selection stage comprising a plurality of selection switches arranged on hierarchical decoding levels, wherein the selecting comprises
supplying to the plurality of selection switches corresponding biasing signals to define a first conductive path between at least one selected column and a driving stage,
supplying a programming current,
bringing the selected column to a desired programming voltage value,
wherein the column decoder further comprises a plurality of protection elements between respective columns and respective ones of the plurality of selection switches,
wherein the plurality of selection switches and the plurality of protection elements comprise metal oxide semiconductor (MOS) transistors having an upper threshold voltage level lower than the desired programming voltage value, and
biasing the plurality of protection elements to reduce occurrence, between terminals of the MOS transistors, of voltages higher than the upper threshold voltage level during the programming operations, selecting a corresponding column using at least one first-level selection switch of the plurality of selection switches, and selecting at least one main column using at least one second-level selection switch of the plurality of selection switches coupled, in a cascaded fashion, to the at least one first-level selection switch to define the first conductive path, the at least one first-level selection switch and the at least one second-level selection switch comprising p-type metal oxide semiconductor (PMOS) transistors, and the programming decoding circuit having a well-biasing terminal for biasing a well region of the PMOS transistors via the programming biasing circuit; and using a control and timing circuit operatively coupled to the programming biasing circuit to define successive biasing steps, preliminary to the programming operations, the control and timing circuit also defining the first conductive path, each of the successive biasing steps corresponding to a respective biasing condition of the plurality of selection switches by the programming biasing circuit, the successive biasing steps including at least a first step of boosting a voltage of at least one internal node of the programming selection circuit to a value greater than or equal to the upper threshold voltage level, the control and timing circuit defining the first step of boosting to include at least one of voltage boosting the at least one main column and of the well-biasing terminal to a first pre-charging voltage lower than the programming voltage value and define the successive biasing steps to further include at least one step of boosting a biasing voltage of a control terminal of the plurality of protection elements up to the first pre-charging voltage.

14. The method according to claim 13, wherein the programming voltage value comprises a boosted value voltage relative to a logic voltage supplied to the memory device, and wherein the plurality of MOS transistors comprises low-voltage transistors.

\* \* \* \* \*

UNITED STATES PATENT AND TRADEMARK OFFICE
CERTIFICATE OF CORRECTION

PATENT NO. : 8,982,615 B2
APPLICATION NO. : 13/780280
DATED : March 17, 2015
INVENTOR(S) : Conte et al.

It is certified that error appears in the above-identified patent and that said Letters Patent is hereby corrected as shown below:

Title page, item 72  Delete: "Syracuse"
Insert: --Siracusa--

In the Claims

Column 19, Line 25, Claim 8  Delete: "corresponding one"
Insert: --corresponding ones--

Column 19, Line 67, Claim 11  Delete: "plurality transistors"
Insert: --plurality of transistors--

Column 20, Line 43, Claim 13  Delete: "corresponding one"
Insert: --corresponding ones--

Signed and Sealed this
Eighth Day of September, 2015

Michelle K. Lee
*Director of the United States Patent and Trademark Office*